United States Patent [19]
Toba et al.

[11] Patent Number: 5,139,923
[45] Date of Patent: Aug. 18, 1992

[54] METHOD FOR IMPROVING ADHESION OF A RESIST LAYER TO A METALLIC LAYER AND ELECTROLESSLY PLATING A WIRING PATTERN THEREON

[75] Inventors: Ritsuji Toba, Hadano; Kanji Murakami, Mito; Mineo Kawamoto, Hitachi, all of Japan

[73] Assignee: Hitachi, Ltd., Tokyo, Japan

[21] Appl. No.: 634,966

[22] Filed: Jan. 3, 1991

Related U.S. Application Data

[63] Continuation of Ser. No. 216,608, Jul. 8, 1988, abandoned.

[30] Foreign Application Priority Data

Jul. 8, 1987 [JP] Japan .................. 62-168638

[51] Int. Cl.⁵ .................................................. G03C 5/00
[52] U.S. Cl. ................................... 430/313; 430/275; 430/277; 430/278; 430/279; 430/314; 430/315; 430/318
[58] Field of Search ............... 430/275, 277, 278, 279, 430/313, 315, 311, 314, 318

[56] References Cited

U.S. PATENT DOCUMENTS

| | | | |
|---|---|---|---|
| 3,450,534 | 6/1969 | MacKellar et al. | 430/319 |
| 3,645,772 | 2/1972 | Jones | 430/315 |
| 4,007,295 | 2/1977 | Poliniak et al. | 430/277 |
| 4,756,795 | 7/1988 | Bakos et al. | 156/645 |

FOREIGN PATENT DOCUMENTS

| | | |
|---|---|---|
| 0158536 | 10/1985 | European Pat. Off. . |
| 0171630 | 2/1986 | European Pat. Off. . |
| 2009018 | 4/1971 | Fed. Rep. of Germany . |
| 61-48831 | 3/1986 | Japan . |

OTHER PUBLICATIONS

W. Foerst et al., *Ullmanns Encyklopaedie Der Technischen Chemie*, Third Edition, vol. 13, pp. 103–104, Urban & Schwarzenberg, Munich-Berline, 1962.

W. Foerst et al., *Ullmanns Encyklopaedie Der Technischen Chemie*, Third Edition, vol. 14, p. 636, Urban & Schwarzenberg, 1963.

*Primary Examiner*—Marion E. McCamish
*Assistant Examiner*—Kathleen Duda
*Attorney, Agent, or Firm*—Pennie & Edmonds

[57] ABSTRACT

In conducting wiring by masking the portion other than the portion to be wired of a metallic laminate with a photoresist for plating and subjecting only the portion to be wired to pattern plating, the provision of a noble metal layer made of gold, platinum or the like, or a metallic layer made of a metal having a larger ionization tendency than that of a metal used in the pattern plating on the metallic layer constituting the undercoat of the photoresist for plating enables the peeling of the resist for plating to be prevented and excellent fine wiring to be conducted.

13 Claims, 1 Drawing Sheet

METHOD FOR IMPROVING ADHESION OF A RESIST LAYER TO A METALLIC LAYER AND ELECTROLESSLY PLATING A WIRING PATTERN THEREON

This is a continuation of application Ser. No. 07/216,608, filed Jul. 8, 1988, now abandoned.

BACKGROUND OF THE INVENTION

This invention relates to a method of wiring a printed circuit board and particularly to a method of wiring a printed circuit board suitable for high-density and fine wiring.

In accordance with a recent trend toward an increase in the density and fineness of a printed circuit board, various proposals have been made in order to attain this purpose. One of the proposals is a method which comprises masking a copper clad laminate as a starting material at the portion other than the portion to be wired with a photoresist for plating and subjecting only the portion to be wire to plating, e.g., electroless copper plating for wiring. In this method, the resist for plating and metallic layer portion unnecessary for wiring (i.e., the metallic layer portion below the resist for plating) is removed after the completion of copper plating of the portion to be wired However, the adhesion between the copper clad laminate and the photoresist for plating is generally poor, which raises a problem that it is impossible to conduct satisfactory wiring because the resist for plating is peeled off during plating. In particular, when fine wiring is intended, the occurrence of the peeling is a serious problem. In order to solve this problem, for example, Japanese Patent Laid-Open No. 48831/1986 has proposed a method which comprises mechanically rubbing the surface of a copper clad laminate etc. with pumice, applying an adhesion promoting agent, such as benzotriazole, to the rubbed surface, and masking the desired portion with a photoresist for plating. This method is one which has given a solution to the problem that the resist for plating is peeled from the surface of the undercoat copper layer during plating. Further, a method in which the same effect can be attained by adding an adhesion promoting agent such as benzotriazole to a photoresist for plating, has been proposed and has made it possible to solve the problem of the above-described peeling.

However, the use of benzotriazole or the like as the adhesion promoting agent in the above-described conventional techniques may have an adverse effect on the plating film. Specifically, in some cases, there have been arisen problems such as a lowering in the physical properties of the plating film, a lowering in the plating rate, and an uneven plating thickness, by the slight dissolving of the benzotriazole into the plating solution. The substance which has such an adverse effect is not limited to benzotriazole alone, and many similar compounds which are considered to serve as an adhesion promoting agent, e.g., heterocyclic compounds, such as 2-mercapto-benzothiazole, have a similar adverse effect. The occurrence of this problem makes it difficult to form a pattern with excellent reliability and, in some cases, makes pattern formation itself impossible.

SUMMARY OF THE INVENTION

An object of the present invention is to eliminate the difficulties accompanying the above-described prior art and to provide an improved wiring method which comprises masking a metal clad laminate as a starting material at the portion other than the portion to be wired with a photoresist for plating and plating only the portion to be wired with a conductive material for wiring and which enables fine wiring to be formed without causing peeling during plating by virtue of sufficient adhesion of the resist for plating to the undercoat metallic layer and without adverse effect on the plating film.

The above-described object can be attained by forming a second metallic layer on the surface of a first metallic layer on which a resist for plating is to be formed. In particular, a large effect can be attained when the second metallic layer is made of a metal having a larger ionization tendency than the metal for wiring pattern plating An investigation on the occurrence of the peeling phenomenon of the resist for plating during pattern plating has led to a conclusion that the occurrence of breaking of an oxide layer present on the surface of the metallic surface layer and being in contact with the resist for plating is a major causative factor of the peeling. Therefore, the prevention of breaking of the oxide layer or the prevention of formation of the oxide layer on the surface of the metallic layer are thought to be effective in preventing the occurrence of the peeling. That is, the breaking of the oxide layer can be prevented by making use of a metal having a larger ionization tendency than the metal for plating as the undercoat metallic layer. It is expected that this expedient enables an oxide layer formed on the surface of an undercoat metallic layer to be stably present between the undercoat metallic layer and the plating without undergoing reduction into a metal due to the plating potential. Various experiments conducted by the present inventors have revealed that the peeling of the resist for plating during plating operation can be prevented by forming a second metallic layer comprising a metal having a larger ionization tendency than that of the metal for plating on the surface of the undercoat metallic layer on which a resist for plating is formed. Further, a study on another expedient for preventing the peeling, i.e., on the prevention of the formation of an oxide layer has revealed that the use of a noble metal, such as gold, for the second metallic layer serves to make the resist for plating difficult to peel off.

Thus the wiring method of the present invention comprises masking an insulating board having a first metallic layer on the surface thereof at the portion other than the portion to be wired with a resist for plating and conducting pattern plating only at the portion to be wired, wherein a second metallic layer made of either a metal having a larger ionization tendency than that of a metal for pattern plating or a noble metal which hardly forms an oxide, such as gold or platinum, is formed on the first metallic layer before said masking with a resist for plating and said pattern plating. The resist for plating and the metallic layer portion unnecessary for wiring are removed after the completion of the above-described pattern plating by a well known method.

Although copper having high conductivity is generally used for pattern plating, the metal for pattern plating is not limited to this alone. A suitable metal used as the second metallic layer and having a larger ionization tendency than the metal for the above-described pattern plating when copper is used for pattern plating is at least one element selected from among aluminum, zinc, tin, chromium, iron, nickel, and cobalt or an alloy containing at least one of these elements in an amount of at least 5% by weight. Further, as described above, at least one element selected from among noble metals, such as gold and platinum, (i.e., gold, silver, and platinum group elements) is suitable as a metal for use in the second metallic layer which hardly forms an oxide.

When the first metallic layer is made of copper and the second metallic layer is made of the above-described element or alloy, the thickness of the second metallic layer is usually preferably 0.01 to 1 $\mu$m. However, even when the thickness is below than the above-described range, an effect is attained to some extent as far as a major portion of the first metallic layer is covered with the second metallic layer. In general, when about 10% or more of the surface of the undercoat layer of the second metallic layer is exposed and is not covered with the second metallic layer, the adhesion of the resist for plating unfavorably becomes poor. On the other hand, when the second metallic layer is excessively thick, the roughness of the surface is decreased, which brings about a lowering in the adhesion of the resist for plating. The upper limit of the thickness of the second metallic layer in the case of the above-described combination is about 1 $\mu$m. Further, in general, no problem is caused when the thickness of the second metallic layer is 1 $\mu$m or less not only in the case of the above-described combination of the metallic layer but also in the case of other combinations. As described above, in the above-described combination of the metallic layer, the thickness of the second metallic layer is preferably 0.01 to 1 $\mu$m. However, in the case of other combinations of the metallic layer, it is preferred to find an optimum condition of the thickness of the second metallic layer by forming the second metallic layer plating and the resist for plating on the first metallic layer and then actually determining the blistering and peeling of the resist.

Although a metallic layer comprising a metal clad laminate may be used a the first metallic layer which is the undercoat of the plating metal, a thin layer of the same metal or a different metal may further be provided as the first metallic layer on the metallic layer comprising the metal clad laminate. A thickness of 10 $\mu$m is sufficient for the thin metallic layer. When the thickness of the thin metallic layer is too small, the thin metallic layer within the through-hole is unfavorably removed by the pretreatment for pattern plating after the formation of the resist for plating. It is generally preferred that the thickness of the thin metallic layer be 2 $\mu$m or more.

In the wiring method according to the present invention, the conventional wiring techniques may be used as far as the above-described second metallic layer is provided on the first metallic layer of an insulating board having the first metallic layer and the resist for plating is formed thereon.

The present invention causes neither peeling of the resist for plating during pattern plating nor influence on the plating film. This enables desired wiring in accordance with the circuit pattern and the circuit drawn by the resist for plating, thus making it possible to form fine wiring.

DESCRIPTION OF THE PREFERRED EMBODIMENTS

The present invention will now be described in more detail with reference to FIGS. 1A to 1F each being a cross-sectional view of a printed wiring board in each step of wiring.

Figure 1A:
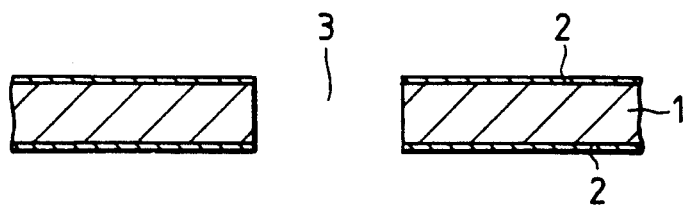
FIGS. 1A to 1F are each a cross-sectional view of the individual steps of one example of the wiring method according to the present invention.

FIG. 1A shows the state of an insulating board 1 provided with a metallic layer 2 and having a hole 3 bored in a desired portion. The first metallic layer 2 is generally made of copper and may be one commercially available in the form of a copper clad laminate. The insulating board 1 may also be made of a wide variety of materials such as commercially available glass epoxy laminate, glass polyimide laminate, and paper phenolic laminate. In the step shown in FIG. 1A, if necessary, it is also possible to previously form a circuit through etching of the metallic layer 2.

Figure 1B:
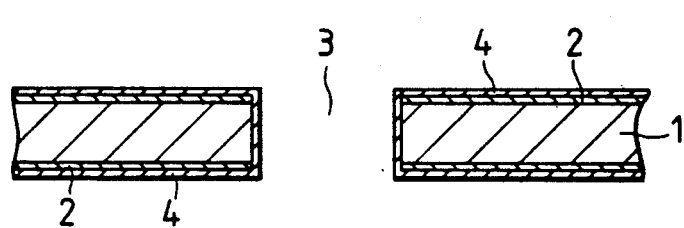

FIG. 1B shows the state of the insulating board in which a thin metallic layer 4 has been formed on the metallic layer 2. The provision of the thin metallic layer 4 is not necessarily required and, if necessary, can be omitted. For example, the thin metallic layer may be omitted when the hole 3 is unnecessary, when the pattern plating of one side is easily connected in the hole 3 to that of the other side because the insulating board 1 is sufficiently thin, when the surface of the hole 3 is in an activated state because of the presence of a catalyst for electroless plating on the surface of the hole 3, etc.

However, the formation of the thin metallic layer 4 ensures more reliable wiring although the number of steps is disadvantageously increased. The thin metallic layer 4 can be formed by any of dry processes, such as vapor deposition, and wet processes, such as plating. However, the wet process is thought to be advantageous from the standpoint of mass productivity. Examples of the wet process include a method in which the thin metallic layer is formed only by electroless copper plating, a method in which electroplating is conducted after electroless plating, or a method in which in general, a catalyst for electroless copper plating is placed in the hole 3 for activation and direct electroplating is conducted. There is no particular limitation with respect to the thickness of the thin metallic layer 4. However, as described above, a thickness of 2 $\mu$m to 10 $\mu$m generally suffices for the thin metallic layer 4.

Figure 1C:
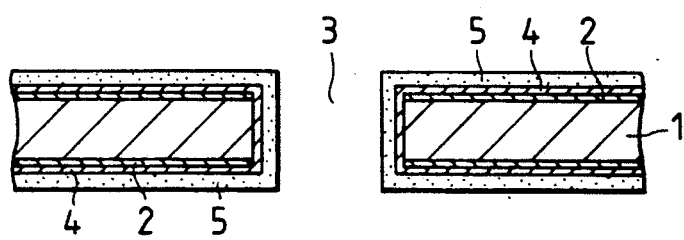

Then, a second metallic layer 5 is formed on the thin metallic layer 4 or the metallic layer 2. FIG. 1C shows a state in which the second metallic layer 5 has been formed on the thin metallic layer 4. A thickness of 1 $\mu$m or less suffices for the second metallic layer. An effect can be attained even when the thickness is such that the color o the metal constituting the second metallic layer is slightly observed, for example, when the thickness is about 0.01 $\mu$m. However, no satisfactory effect can be attained when the thin metallic layer 4 constituting the undercoat of the second metallic layer 5 or the surface of the metallic layer 2 is exposed over a wide area (about 10% or more). In the combination other than that of the above-described materials when the first metallic layer is made of copper, the thickness varies depending upon the roughness of the surface and the kind of the metal, which makes it necessary to find out an optimum condition for practical use. Examples of the method of forming the second metallic layer include dry processes, such as vapor deposition, sputtering, and ion plating and wet processes, such as electroless plating, electroplating, and substitution plating. The second metallic layer can be formed by any of the above-described methods.

Figure 1D:
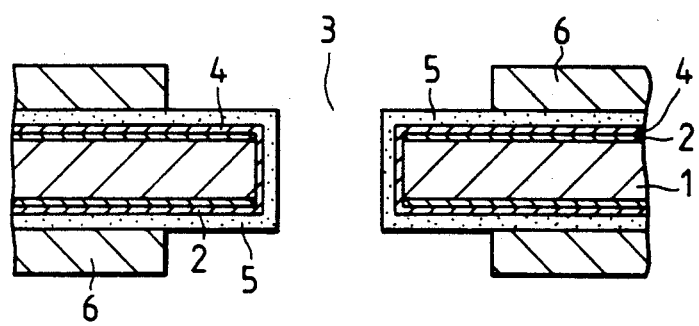

Subsequently, as shown in FIG. 1D, the portion other than the portion to be wired is masked with a resist for plating 6. It is preferred to coarsen the surface of the second metallic layer 5 previously in order to enhance the adhesion between the resist for plating 6 and the second metallic layer 5 constituting the undercoat. Examples of the method of coarsening the surface of the second metallic layer 5 include a method in which the surface of the second metallic layer is directly coarsened by mechanical or chemical means and a method in which the thin metallic layer 4 or metallic layer 2 constituting the undercoat of the second metallic layer 5 is previously coarsened. When the method in which the thin metallic layer 4 or metallic layer 2 is previously coarsened is used rather than the method in which the second metallic layer 5 is directly coarsened, all metals irrespective of the kind of the second metallic layer 5 can be coarsened by the same method.

When the thin metallic layer 4 or metallic layer 2 is made of copper, the following coarsening method is effective in improving the evenness of the coarsening and the bonding strength. One of the coarsening methods comprises coarsening the surface of the copper with a treating solution containing an etching agent, e.g., a persulfate such as ammonium persulfate or sodium persulfate, or cupric chloride. When the surface of the copper is to be further coarsened, the coarsening with the treating solution containing the above-described etching agent is followed by the oxidation of the coarsened surface with a chlorite, such as sodium chlorite or potassium chlorite, and then a treatment with a reducing treatment solution to reconvert the resulting copper oxide into the metallic copper. This treatment enables further coarsening of the surface of the copper. A treating solution containing an amineborane compound, such as dimethylamineborane, is particularly useful as the reducing treatment solution. Further, the surface which has been oxidized with the above-described chlorite or the like may be electrically subjected to cathodic reduction. Either of the above-described methods may be used in the present invention The resist for plating 6 shown in FIG. 1D is formed at the desired portion by printing or a photographic method. The photographic method is advantageous for attaining the object of the present invention, i.e., for forming fine wiring. Examples of the resist for plating which can be applied to the photographic method include a photosensitive dry film resist and a liquid resist. It is possible to add an agent capable of improving the adhesion of the resist for plating, such as benzotriazole, to the resist for plating in such an amount as will have no adverse effect on the plating characteristics, i.e., in an amount of 0.001 to 0.5% by weight. The resist for plating may be a commercially available one, e.g., a negative photoresist used in the step of photoetching.

Figure 1E:
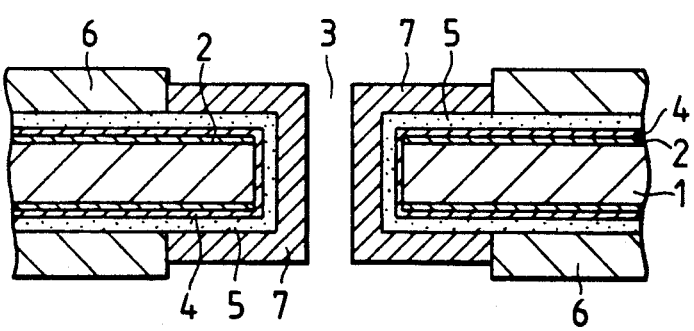

Then, wiring is conducted by providing a pattern plating layer 7 as shown in FIG. 1E. Copper plating is best suited as the pattern plating for wiring from the viewpoint of conductivity. Examples of the copper plating include electroless copper plating, electro-copper plating, and a combination of them. When the hole 3 is small, the electroless copper plating is advantageous from the viewpoint of the throwing power ratio of the through hole plating. When the pattern plating layer 7 is to be formed, the second metallic layer 5 in an exposed state may be left as it is. However, when zinc or the like is used for the second metallic layer, it is preferred from the viewpoint of corrosion resistance to remove the second metallic layer In this case, the second metallic layer can be removed with an inorganic acid or the like.

As described above, in forming the pattern plating layer 7, the second metallic layer 5 is not necessarily required as the undercoat of the pattern plating and may be removed. Similarly, in the inside of the hole 3, the presence of the second metallic layer 5 as well as the thin metallic layer 4 is not necessarily required. However, in order to ensure the pattern plating of the inside of the hole 3, it is preferred to apply, prior to the pattern plating, a catalyst for electroless plating on the surface thereof for activation. It is preferred from the viewpoint of reliability to conduct in the next step, either pattern plating throughout by electroless plating, or thin plating by electroless plating followed by electroplating. In particular, it is preferred to apply a catalyst for electroless plating on the inner surface of the hole 3 for activation and form the thin metallic layer 4 by electroless plating. Special care should be taken of the method which comprises coarsening the thin metallic layer 4 and the second metallic layer 5 and applying thereafter the catalyst for electroless plating for activation, because this method may often cause the coarsened surface to be denatured and the adhesion between the coarsened surface and the resist for plating 6 to be lowered.

Figure 1F:
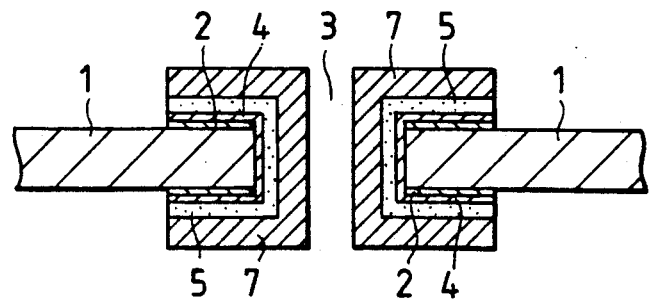

After the completion of the step shown in FIG. 1E, the resist for plating and the unnecessary metallic layer are removed by an ordinary method, thereby forming final wiring In one example of the well known method, soldering plating is further conducted on the pattern plating layer to form a resist for etching. Subsequently, the above-described resist for plating 6 is removed. The above-described second metallic layer 5, the thin metallic layer 4, and the metallic layer 2 other than the etching resist formed on the circuit are etched away with the etching resist. When the metallic layer 2, the thin metallic layer 4 and the second metallic layer 5 are thin, differential etching may directly be conducted to form wiring without conducting the soldering plating. When the soldering plating is conducted, if necessary, it may be removed in the final step FIG. 1F is a cross-sectional view of a state of a structure in which all of the above-described steps have been completed, i.e., a final structure.

Although the above description has been made mainly by referring to the pattern plating in the case where the metallic layer is present on the whole underlying surface, the present invention can also quite equally be applied to the method which comprises previously forming a wiring pattern as a first metallic layer on the surface of an insulating board and conducting electroless plating only on the hole and necessary wiring portion, such as a pad for a through hole, to form a printed circuit board.

Further, the present invention can also be applied to the case where the above-described double-side printed circuit board is multilayered to prepare a multilayered printed circuit board The present invention will now be described in more detail with reference to the following examples.

EXAMPLE 1

A double-side copper clad laminate having a board thickness of 0.1 mm and a copper thickness of 9 μm was degreased with an alkali, washed with water, and then treated for 1 min with a soft etching solution (30° C.) prepared by dissolving 200 g of ammonium persulfate and 5 ml of 98% sulfuric acid in water so as to have a final volume of 1 l. The treated laminate was washed with water and then plated with zinc in an electro-zinc plating bath (Zincalux; a product of Schering Corp.) for 1 min at an apparent current density of 1 A/dm$^2$, thereby forming a second metallic layer having a thickness of 0.2 μm. The plated laminate was washed with water and dried, and a 50 μm-thick photosensitive dry film SR-3200 (trademark of a product of Hitachi Chemical Co., Ltd.) was laminated thereon, followed by exposure and development to prepare a desired negative wiring pattern for use as a resist for plating. The thus-treated laminate was further treated with 3% sulfuric acid for 2 min, washed with water and then plated with copper in an electroless copper plating solution (71° C.) having the following composition to form 30 μm-thick copper plating as pattern plating, thereby conducting wiring:

| | |
|---|---|
| CuSO$_4$.5H$_2$O | 10 g/l |
| disodium ethylenediaminetetraacetate | 30 g/l |
| 37% HCHO | 3 ml/l |
| NaOH | 12 g/l |
| 2,2'-dipyridyl | 30 mg/l |
| polyethylene glycol (average molecular weight: 600) | 10 g/l |

The laminate having the pattern plating layer was washed with water and then with an acid, followed by soldering plating on the pattern plating layer by making use of the following soldering plating solution:

| | |
|---|---|
| Sn (BF$_4$)$_2$ | 37 g/l |
| Pb(BF$_4$)$_2$ | 18 g/l |
| H$_3$BO$_3$ | 35 g/l |
| HBF$_4$ | 270 g/l |
| peptone | 4 g/l |

The current density, plating time, and liquid temperature were 1 A/dm$^2$, 20 min, and 20° to 25° C., respectively. After the completion of soldering plating, the resist for plating was removed with methylene chloride, and the unnecessary metallic layer present below the resist for plating was etched away by making use of the above-described soldering plating layer as a resist for etching. An alkaline etching solution manufactured by Meltex Corp. was used as the etching solution. Further, the product was washed with water to complete wiring according to the wiring method of the present invention. The composition of the alkaline etching solution was as follows:

| | |
|---|---|
| Cu$^{++}$ | 145 g/l |
| Cl$^-$ | 152 g/l |
| ammonia | 8.9 g/l |

The above-described term "apparent current density" is intended to mean a current density obtained through calculation on the assumption that the surface of the metallic layer is smooth. In an actual case, since the surface of the metallic layer is coarsened, the metallic layer has a surface area larger than it looks, and the actual current density is lower than the apparent current density. Therefore, the actual thickness of the plating layer is smaller than the thickness calculated from the apparent current density.

EXAMPLE 2

Holes were bored in the necessary portion of a double-side copper clad laminate having a substrate thickness of 1 mm and a copper thickness of 18 μm. Then, the laminate was degreased with an alkali, washed with water, and treated for 1 min with a soft etching solution (30° C.) prepared by dissolving 200 g of ammonium persulfate and 5 ml of 98% sulfuric acid in water so as to have a final volume of 1 l. The treated laminate was washed with water, treated with 15% hydrochloric acid for 1 min and then with a catalyst solution (HS101B; a product of Hitachi Chemical Co., Ltd.) at 20° C. for 5 min, washed with water, treated with 3% hydrochloric acid at 20° C. for 5 min, and then washed with water, thereby conducting activation. The activated laminate was plated in an electroless copper plating solution (70° C.) having the following composition to form a 5 μm-thick copper plating layer:

| | |
|---|---|
| CuSO$_4$.5H$_2$O | 10 g/l |
| disodium ethylenediaminetetraacetate | 30 g/l |
| 37% HCHO | 3 ml/l |
| NaOH | 12 g/l |
| 2,2'-dipyridyl | 20 mg/l |
| polyethylene glycol monomethyl ether | 0.5 g/l |
| potassium ferrocyanide | 2 mg/l |

The plated laminate was washed with water and then plated with zinc in an electro-zinc plating bath (Zincalux; a product of Schering Corp.) for 1 min at an apparent current density of 1 A/dm$^2$, thereby forming a second metallic layer having a thickness of 0.2 μm. Then, the plated laminate was washed with water and dried, and a 50 μm-thick photosensitive dry film SR-3200 was laminated thereon, followed by exposure and development to prepare a desired negative wiring pattern for use as a resist for plating. The laminate having the resist for plating was treated with 3% sulfuric acid for 2 min, washed with water and then plated with copper in an electro-copper plating solution comprising 60 g/l of copper sulfate and 200 g/l of sulfuric acid at 30° C. and 3 A/dm$^2$ for 50 min to form a copper pattern plating layer having an average thickness 33 μm, thereby forming a circuit. Thereafter, the resist for plating and the unnecessary metallic layer were removed in the same manner as that of Example 1.

EXAMPLE 3

Holes were bored in the necessary portion of a double-side copper clad laminate having a board thickness of 1 mm and a copper thickness of 18 μm. Then, the laminate was degreased with an alkali, washed with water, and treated for 1 min with a soft etching solution (30° C.) prepared by dissolving 200 g of ammonium persulfate and 5 ml of 98% sulfuric acid in water so as to have a final volume of 1 l. The treated laminate was washed with water, treated with 15% hydrochloric acid for 1 min, immersed in a catalyst solution HS101B (trademark of a product of Hitachi Chemical Co., Ltd.) at 20° C. for 5 min, washed with water, treated with 3% hydrochloric acid at 20° C. for 5 min, and then washed with water, thereby conducting activation. The surface of the copper was coarsened by buff brushing and pumice brushing t have a satin finish, washed with water, and subjected to electro-zinc plating in the same manner as that of Example 1 to form a second metallic layer having a thickness of 0.2 μm, followed by laminating with a photosensitive dry film, exposure, development, and electroless copper plating, thereby forming a circuit. Thereafter, the resist for plating and the unnecessary metallic layer were removed in the same manner as that of Example 1.

EXAMPLE 4

Holes were bored in the necessary portion of a double-side copper clad laminate having a board thickness of 1 mm and a copper thickness of 18 μm. Then, the laminate was degreased with an alkali, washed with water, and treated for 1 min with a soft etching solution (30° C.) prepared by dissolving 200 g of ammonium persulfate and 5 ml of 98% sulfuric acid in water so as to have a final volume of 1 l. The treated laminate was washed with water and then plated for 2 min with gold at an apparent current density of 1 A/dm$^2$ in an electrogold plating bath prepared by dissolving 7 g of potassium gold syanide and 20 g of potassium cyanide in water so as to have a final volume of 1 l, thereby forming a second metallic layer having a thickness of 0.8 μm. The gold-plated laminate was sufficiently washed with water, immersed in 15% hydrochloric acid for 1 min, immersed in a catalyst solution (HS101B; a product of Hitachi Chemical Co., Ltd.) at 20° C. for 5 min, washed with water, treated with 3% hydrochloric acid at 20° C. for 5 min, and then washed with water, thereby conducting activation. The activated gold-plated laminate was washed with water and dried, followed by laminating with a photosensitive dry film, exposure, development, and electroless copper plating in the same manner as that of Example 1, thereby forming a circuit. Thereafter, the resist for plating and the unnecessary metallic layer were removed in the same manner as that of Example 1.

EXAMPLE 5

Holes were bored in the necessary portion of a double-side copper clad laminate having a board thickness of 1 mm and a copper thickness of 18 μm. Then, the laminate was degreased with an alkali, washed with water, and treated for 1 min with a soft etching solution (30° C.) prepared by dissolving 200 g of ammonium persulfate and 5 ml of 98% sulfuric acid in water so as to have a final volume of 1 l. The treated laminate was washed with water, immersed in 15% hydrochloric acid for 1 min, immersed in a catalyst solution (HS101B; a product of Hitachi Chemical Co., Ltd.) at 20° C. for 5 min and washed with water. The treated laminate was immersed for 2 min in a treating solution (75° C.) comprising 90 g/l of sodium chlorite, 15 g/l of sodium hydroxide and 30 g/l of sodium phosphate and washed with water. The treated laminate was then immersed for 1 min in an aqueous solution containing 6 g/l of dimethylamineborane and 5 g/l of sodium hydroxide (40° C.) to reduce the resulting oxide film and sufficiently washed with water, followed by electro-zinc plating, laminating with a photosensitive dry film, exposure, development, and electroless copper plating, in the same manner as that of Example 1, thereby forming a circuit. The thickness of the second metallic layer comprising zinc was 0.01 μm. The resist for plating and the unnecessary metallic layer were removed in the same manner as that of Example 1.

EXAMPLE 6

Holes were bored in the necessary portion of a double-side copper clad laminate having a board thickness of 1 mm and a copper thickness of 18 μm. Then, the laminate was degreased with an alkali, washed with water, and treated for 1 min with a soft etching solution (30° C.) prepared by dissolving 200 g of ammonium persulfate and 5 ml of 98% sulfuric acid in water so as to have a final volume of 1 l. The treated laminate was washed with water, immersed in 15% hydrochloric acid for 1 min, immersed in a catalyst solution HS101B at 20° C. for 5 min, washed with water, treated with 3% hydrochloric acid at 20° C. for 5 min, and then washed with water, thereby conducting activation. The activated laminate was plated in an electroless copper plating solution (70° C.) having the following composition to form a 5 μm-thick copper plating layer:

| | |
|---|---|
| CuSO$_4$.5H$_2$O | 10 g/l |
| disodium ethylenediaminetetraacetate | 30 g/l |
| 37% HCHO | 3 ml/l |
| NaOH | 12 g/l |
| 2,2'-dipyridyl | 20 mg/l |
| polyethylene glycol monomethyl ether | 0.5 g/l |
| potassium ferrocyanide | 2 mg/l |

The plated laminate was washed with water and then treated for 20 sec with an etching solution (45° C.) containing 500 ml/l of hydrochloric acid and 40 g/l of cupric chloride (dihydrate), immediately washed with water, and further immersed in an oxidizing solution (70° C.) comprising 90 g/l of sodium chlorite, 15 g/l of sodium hydroxide, and 30 g/l of sodium phosphate. The treated copper-plated laminate was immersed for 1 min in a reducing solution (30° C.) comprising 6 g/l of dimethylamineborane and 5 g/l of sodium hydroxide to reduce the resulting oxide film, followed by washing sufficiently with water and plating with zinc in an electro-zinc plating bath (Zincalux; a product of Schering Corp.) at room temperature for 5 min at an apparent current density of 0.5 A/dm$^2$, thereby forming a second metallic layer having a thickness of 0.02 μm. Then, the zinc-plated laminate was washed with water and dried, and a 50 μm-thick photosensitive dry film SK-3200 (trademark of a product of Hitachi Chemical Co., Ltd.) was laminated thereon, followed by exposure and development to prepare a desired negative wiring pattern. The laminate having the negative pattern was treated with 3 % sulfuric acid for 5 min, washed with water and then subjected to pattern plating of about 30 μm in a electroless copper plating solution (72° C.) having the following composition to conduct wiring:

| | |
|---|---|
| CuSO$_4$.5H$_2$O | 10 g/l |
| disodium ethylenediaminetetraacetate | 30 g/l |
| 37% HCHO | 3 ml/l |
| NaOH | 12 g/l |
| 2,2'-dipyridyl | 30 mg/l |
| polyethylene glycol (average molecular weight: 600) | 20 g/l |

Thereafter, the resist for plating and the unnecessary metallic layer were removed in the same manner as that of Example 1.

EXAMPLE 7

A circuit was formed in the same manner as that of Example 6, except that a second metallic layer having a thickness of 0.03 μm was formed by conducting tin plating in an electro-tin plating bath (20° C.) having the following composition at an apparent current density of 0.5 A/dm² for 5 min instead of the electro-zinc plating conducted in Example 6:

| | |
|---|---|
| tin sulfate | 30 g/l |
| sulfuric acid | 100 ml/l |
| additive (Ronastan; a product of Meltex Corp.) | 30 ml/l |

EXAMPLE 8

Wiring was conducted in the same manner as that of Example 6, except that a second metallic layer having a thickness of 0.01 μm was formed by conducting nickel plating in an electro-nickel plating bath (20° C.) having the following composition at an apparent current density of 0.5 A/dm² for 3 min instead of the electro-zinc plating conducted in Example 6:

| | |
|---|---|
| $NiSO_4.6H_2O$ | 200 g/l |
| $HBO_3$ | 15 g/l |
| NaCl | 15 g/l |

EXAMPLE 9

Wiring was conducted in the same manner as that of Example 6, except that a second metallic layer was formed by vapor deposition of aluminum on the surface of the board to form a layer having a thickness of about 0.1 μm instead of the electro-zinc plating conducted in Example 6 and the removal of aluminum on the plating surface was conducted with a treating solution having the following composition instead of the treatment with sulfuric acid after formation of the resist for plating:

| | |
|---|---|
| $H_3PO_4$ | 400 ml/l |
| $CH_3COOH$ | 400 ml/l |
| $HNO_3$ | 100 ml/l |

EXAMPLE 10

Wiring was conducted in the same manner as that of Example 6, except that a second metallic layer was formed by vapor deposition of chromium on the surface of the board to form a layer having a thickness of about 0.1 μm instead of the electro-zinc plating conducted in Example 6 and the complete removal of chromium on the plating surface was conducted with a hydroxy alkaline aqueous potassium ferricyanide solution instead of the treatment with sulfuric acid after the formation of the resist for plating.

EXAMPLE 11

Wiring was conducted in the same manner as that of Example 6, except that a second metallic layer having a thickness of 0.008 μm was formed by conducting gold plating in an electroplating bath (20° C.) having the following composition at an apparent current density of 0.2 A/dm² for 2 min instead of the electro-zinc plating conducted in Example 6:

| | |
|---|---|
| $KAu(CN)_2$ | 7 g/l |
| KCN | 20 g/l |

EXAMPLE 12

Wiring was conducted in the same manner as that of Example 6, except that a second metallic layer was formed by conducting Fe-Ni alloy plating in an electroless plating bath (90° C.) having the following composition to form a coating having a thickness of about 0.1 μm:

| | |
|---|---|
| $FeSO_4.7H_2O$ | 14 g/l |
| $NiSO_4.6H_2O$ | 13 g/l |
| sodium citrate | 74 g/l |
| $NaH_2PO_2.H_2O$ | 21 g/l |
| $HBO_3$ | 30 g/l |
| NaOH | pH 9 |

EXAMPLE 13

Holes were bored in the necessary portion of a double-side copper clad laminate having a board thickness of 1 mm and a copper thickness of 35 μm. Then, the laminate was subjected to buff brushing and pumice brushing to coarsen the surface thereof. The coarsened laminate was washed with water and dried, and a photosensitive dry film having a thickness of 35 μm (Laminar GSI; a product of Dynachem Corp.) was then laminated thereon, followed by exposure and development, thereby forming a circuit pattern. The patterned laminate was subjected to etching with an aqueous cupric chloride solution acidified with hydrochloric acid to form a surface circuit. The laminate having the surface circuit was washed with water, and the remaining dry film in the form of a circuit was then removed with methylene chloride. The surface was coarsened by buff brushing and treated for 1 min with a soft etching solution (30° C.) prepared by dissolving 200 g of ammonium persulfate and 10 ml of sulfuric acid in water to have a final volume of 1 l. The treated laminate was then washed with water, immersed in 15% hydrochloric acid for 1 min, immersed in a catalyst solution (HS101B; a product of Hitachi Chemical Co., Ltd.) at 20° C. for 5 min, washed with water, further immersed in 15% hydrochloric acid, and washed with water, thereby conducting the activation. The activated laminate was then immersed in an electroless tin plating bath LT-26 (trademark of a product of Shipley Co.) at 85° C. for 5 sec to form a second metallic layer having a thickness of 0.08 μm. The laminate having the second metallic layer was washed with water and dried, and a photosensitive dry film SR-3200 having a thickness of 35 μm was laminated thereon, followed by exposure and development to expose only the portion to be wired. The laminate was then treated with 3% sulfuric acid for 5 min, and the exposed portion was subjected to electroless copper plating under the same conditions as those of Example 1, thereby completing intended wiring.

EXAMPLE 14

Holes were bored in the necessary portion of a double-side copper clad laminate having a board thickness of 1 mm and a copper thickness of 35 μm. Then, the laminate was subjected to buff brushing and pumice brushing to coarsen the surface thereof. The coarsened laminate was washed with water and dried, and a photosensitive dry film having a thickness of 35 μm (Laminar GSI; a product of Dynachem Corp.) was then laminated thereon, followed by exposure and development, thereby forming a circuit pattern. The patterned laminate was subjected to etching with an aqueous cupric chloride solution acidified with hydrochloric acid to form a surface circuit. The laminate having the surface circuit was washed with water, and the remaining dry film in the form of a circuit was then removed with methylene chloride. The surface was coarsened by buff brushing and treated for 1 min with a soft etching solution (30° C.) prepared by dissolving 200 g of ammonium persulfate and 10 ml of sulfuric acid in water to have a final volume of 1 l. The treated laminate was then washed with water, immersed in 15% hydrochloric acid for 1 min, immersed in a catalyst solution HS101B (a product of Hitachi Chemical Co., Ltd.) at 20° C. for 5 min, washed with water, further immersed in 15% hydrochloric acid, and washed with water, thereby conducting the activation. The activated laminate was immersed for 2 min in an oxide film forming treatment solution (75° C.) comprising 90 g/l of sodium chlorite, 15 g/l of sodium hydroxide, and 30 g/l of sodium phosphate and then washed with water. The treated laminate was immersed for 1 min in a reducing solution (40° C.) comprising 6 g/l of dimethylamineborane and 5 g/l of sodium hydroxide to reduce the resulting oxide film. The laminate was then sufficiently washed with water, followed by immersion in an electroless nickel plating bath (90° C.) having the following composition for 5 min, thereby forming a second metallic layer comprising a nickel plating layer having a thickness of 0.1 μm:

| | |
|---|---|
| $NiSO_4.6H_2O$ | 35 g/l |
| sodium citrate | 10 g/l |
| sodium acetate | 10 g/l |
| $NaH_2PO_2.H_2O$ | 10 g/l |
| NaOH | pH 5.6 |

Subsequently laminating with a photosensitive dry film, exposure, development, and electroless copper plating were conducted under the same conditions as those of Example 1, thereby completing intended wiring.

EXAMPLE 15

Holes were bored in the necessary portion of a double-side copper clad laminate having a board thickness of 1 mm and a copper thickness of 35 μm. Then, the laminate was degreased with an alkali, washed with water, and treated for 1 min with a soft etching solution (30° C.) prepared by dissolving 200 g of ammonium persulfate and 10 ml of sulfuric acid in water to have a final volume of 1 l. Thereafter, the treated laminate was immersed for 2 min in an oxide film forming treatment solution (75° C.) comprising 90 g/l of sodium chlorite, 15 g/l of sodium hydroxide, and 30 g/l of sodium phosphate and further washed with water. The treated laminate was then subjected to electrolytic reduction in an electrolytic solution comprising 100 g/l of $Na_2SO_4$ and 10 g/l of NaOH. The laminate was washed with water and then plated with nickel in an electroplating bath (30° C.) having the following composition at an apparent current density of 0.5 A/dm$^2$ for 1 min to form a second metallic layer having a thickness of 0.003 μm:

| | |
|---|---|
| $NiSO_4.6H_2O$ | 200 g/l |
| $HBO_3$ | 15 g/l |
| NaCl | 15 g/l |

The laminate having the second metallic layer was washed with water, and a photosensitive dry film having a thickness of 35 μm (Laminar GSI; a product of Dynachem Corp.) was then laminated thereon, followed by exposure and development, thereby forming a resist for a circuit pattern. The metal of the portion other than the portion of the circuit pattern was removed by etching to conduct intended wiring. The remaining photosensitive dry film in the form of a circuit was then removed with methylene chloride. The resulting laminate was washed with water, immersed in 15% hydrochloric acid for 1 min, immersed in a catalyst solution (HS101B; a product of Hitachi Chemical Co., Ltd.) at 20° C. for 5 min, and washed with water. The washed laminate was then dried, and a photosensitive dry film SR-3200 having a thickness of 35 μm was laminated thereon, followed by exposure and development to expose only the portion to be wired. Then, the laminate was treated with 3% sulfuric acid for 5 min, followed by electroless copper plating of the exposed portion under the same conditions as those of Example 1, thereby completing intended wiring.

COMPARATIVE EXAMPLE 1

Wiring was conducted in the same manner as that of Example 1, except that no electro-zinc plating was conducted.

COMPARATIVE EXAMPLE 2

Wiring was conducted in the same manner as that of Example 2, except that no electro-zinc plating was conducted.

COMPARATIVE EXAMPLE 3

Wiring was conducted in the same manner as that of Example 3, except that no electro-gold plating was conducted.

COMPARATIVE EXAMPLE 4

Wiring was conducted in the same manner as that of Example 4, except that no electro-zinc plating was conducted.

COMPARATIVE EXAMPLE 5

Wiring was conducted in the same manner as that of Example 5, except that no electro-zinc plating was conducted.

COMPARATIVE EXAMPLE 6

Wiring was conducted in the same manner as that of Example 6, except that no electro-zinc plating was conducted.

COMPARATIVE EXAMPLE 7

Wiring was conducted in the same manner as that of Example 13, except that no electro-tin plating was conducted.

COMPARATIVE EXAMPLE 8

Wiring was conducted in the same manner as that of Example 14, except that no electroless nickel plating was conducted.

COMPARATIVE EXAMPLE 9

Wiring was conducted in the same manner as that of Example 15, except that no electro-nickel plating was conducted.

In the above Examples 1 to 15, intended wiring could be conducted without substantially causing peeling between the resist for plating and the undercoat. On the other hand, in Comparative Examples 1 to 8, no satisfactory wiring could be conducted because peeling was observed over a wide area between the resist for plating and the undercoat and the solution for pattern plating infiltrated part of the peeled portion.

As described above, in Examples 1 to 12, intended excellent printed circuit boards were prepared by removing the second metallic layer and the copper foil layer other than those of the wired portion according to an ordinary method described in Example 1.

In the above-described drawings, the same numeral represents the same portion.

As is also apparent from the above-described Examples, the present invention causes no peeling of the resist for plating from the undercoat comprising a metallic layer and therefore can exhibit a sufficient effect in fine wiring.

What is claimed is:

1. A method for improving the adhesion of a resist material on an insulating board having a first metallic layer on the surface thereof and for providing a wiring pattern by electroless plating with copper, comprising the steps of:
   a) depositing a second metallic layer of at least one element, or an alloy containing at least 5% by weight of at least one element, selected from the group consisting of aluminum, zinc, tin, chromium, iron, nickel and cobalt, said second metallic layer having a higher ionization tendency than that of copper which is to be electroless plated and that of said first metallic layer, on said first metallic layer, causing said resist material to adhere better thereto than said first metallic layer;
   b) depositing said resist material on said second metallic layer at areas other than areas to be plated with a wiring pattern;
   c) electroless plating a wiring pattern with copper on the areas of said second metallic layer not deposited with said resist material.

2. A method according to claim 1, wherein the thickness of said second metallic layer is 1 μm or less.

3. A method according to claim 1, wherein said second metallic layer is formed by plating.

4. A method according to claim 1, wherein the surface of said first metallic layer constituting the undercoat of said second metallic layer or the surface of said second metallic layer is coarsened.

5. A method according to claim 1, wherein said second metallic layer at said areas not deposited with said resist material to which electroless plating is to be applied is removed prior to the electroless plating.

6. A method according to claim 1, further comprising a step of surface activation for electroless plating prior to forming said second metallic layer.

7. A method according to claim 1, wherein said first metallic layer has a circuit pattern prior to the formation of the resist for plating and the circuit portion is further formed by electroless plating.

8. A method according to claim 1, further comprising a step of removing the resist for plating and an unnecessary metallic layer after the completion of said electroless plating.

9. A method according to claim 1, wherein said first metallic layer comprises copper.

10. A method according to claim 9, wherein the surface of said first metallic layer made of copper is oxidized and then reduced for coarsening.

11. A method according to claim 10, wherein said oxidation is conducted with a treating solution containing a chlorite and said reduction is conducted electrically or chemically with a treating solution comprising an amineborane solution.

12. A method according to claim 9, wherein a thin copper layer is formed over said first copper metallic layer which constitutes an undercoat of said second metallic layer.

13. A method according to claim 12, wherein said thin copper layer is formed by electroplating or electroless plating.

* * * * *